(12) United States Patent
Onaka

(10) Patent No.: US 9,025,955 B2
(45) Date of Patent: May 5, 2015

(54) AMPLIFICATION APPARATUS AND COMMUNICATION SYSTEM

(71) Applicant: Fujitsu Limited, Kawasaki-shi, Kanagawa (JP)

(72) Inventor: Miki Onaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 14/049,255

(22) Filed: Oct. 9, 2013

(65) Prior Publication Data
US 2014/0161453 A1  Jun. 12, 2014

(30) Foreign Application Priority Data

Dec. 7, 2012 (JP) .................................. 2012-268748

(51) Int. Cl.

| | | |
|---|---|---|
| H04B 10/07 | (2013.01) | |
| H04B 10/29 | (2013.01) | |
| H04J 14/02 | (2006.01) | |
| H04B 10/071 | (2013.01) | |
| H04B 10/291 | (2013.01) | |
| H04B 10/297 | (2013.01) | |
| H04J 14/08 | (2006.01) | |
| H01S 3/10 | (2006.01) | |
| H01S 5/50 | (2006.01) | |

(52) U.S. Cl.
CPC ......... *H04J 14/0282* (2013.01); *H01S 3/10023* (2013.01); *H04B 10/07* (2013.01); *H04B 10/29* (2013.01); *H01S 5/50* (2013.01); *H04B 10/071* (2013.01); *H04B 10/2914* (2013.01); *H04B 10/2972* (2013.01); *H04J 14/086* (2013.01)

(58) Field of Classification Search
CPC .... H04B 10/07; H04B 10/071; H04B 10/073; H04B 10/0731; H04B 10/077; H04B 10/0771; H04B 10/0773; H04B 10/0775; H04B 10/0779; H04B 10/29; H04B 10/291; H04B 10/2914; H04B 10/2918; H04B 10/297; H04B 10/2972; H04B 10/299; H04B 17/00; H04B 17/0082; H04B 17/0085; H04B 17/0087; H04B 17/009
See application file for complete search history.

(56) References Cited

U.S. PATENT DOCUMENTS

2005/0271384 A1* 12/2005 Lee et al. ........................ 398/13

FOREIGN PATENT DOCUMENTS

| CA | 2264421 | 9/1999 |
|---|---|---|
| JP | 8-330650 | 12/1996 |
| JP | 11-274625 | 10/1999 |
| JP | 2004-133351 | 4/2004 |
| JP | 2004-228813 | 8/2004 |

* cited by examiner

*Primary Examiner* — Darren E Wolf
(74) *Attorney, Agent, or Firm* — Staas & Halsey LLP

(57) ABSTRACT

An amplification apparatus includes: a circulator to receive, at a first terminal, first signal light transmitted from OLT to ONU and first light having a predetermined wavelength different from the first signal light and, at a third terminal, second signal light transmitted from ONU to OLT and second light having the predetermined wavelength; a first reflector to output reflected light back to a second terminal; a first optical amplifier to have an amplification band characteristic of amplifying at least the first signal light; a second reflector to output reflected light back to a fourth terminal; a second optical amplifier to have an amplification band characteristic of amplifying the second signal light without amplifying the second light having the predetermined wavelength; and a first partial reflector to have a wavelength transmission characteristic of outputting the light having a wavelength different from the predetermined wavelength to the second optical amplifier.

18 Claims, 12 Drawing Sheets

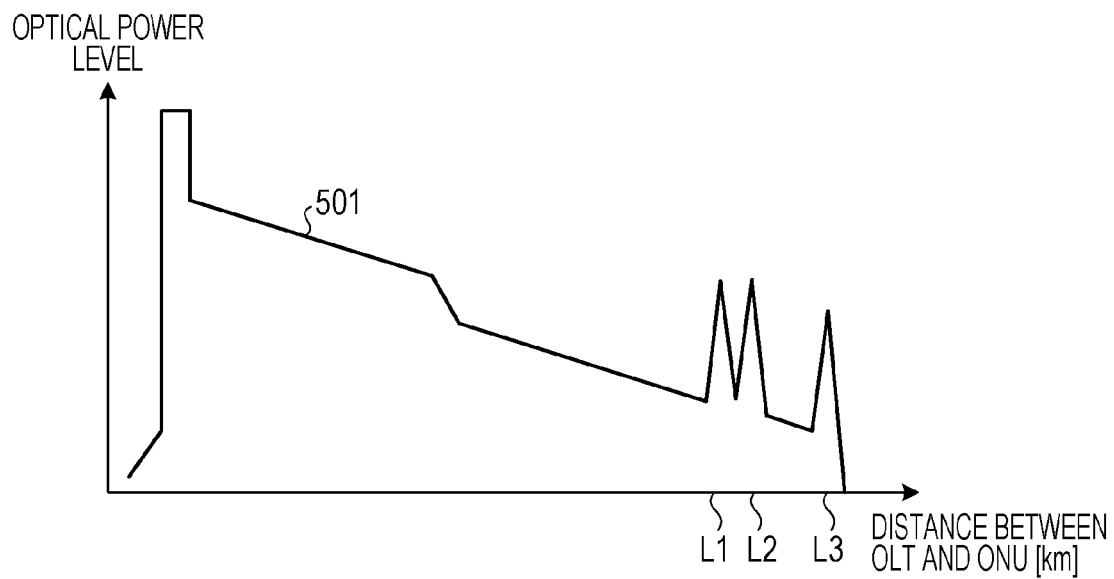
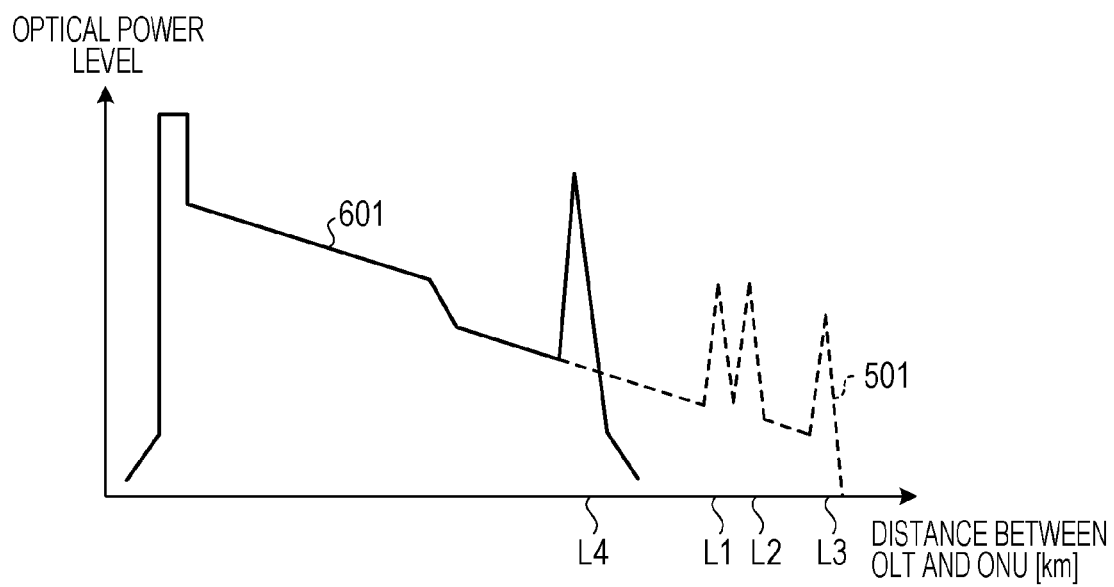

AMPLIFICATION APPARATUS AND COMMUNICATION SYSTEM

CROSS-REFERENCE TO RELATED APPLICATION

This application is based upon and claims the benefit of priority of the prior Japanese Patent Application No. 2012-268748, filed on Dec. 7, 2012, the entire contents of which are incorporated herein by reference.

FIELD

The embodiment discussed herein is related to an amplification apparatus that amplifies light and a communication system.

BACKGROUND

A passive optical network (PON) system is known in which an optical line terminal (OLT) and a plurality of optical network units (ONUs) are connected to each other by a coupler.

As the distance of transmission performed in the PON system becomes longer, it is desired to provide an optical amplifier along a transmission path. In addition, as an optical amplifier for bidirectional optical transmission, a configuration using a fully circulating type four-terminal optical circulator is known (for example, refer to Japanese Laid-open Patent Publication No. 11-274625).

In addition, a technique for detecting a failure in the transmission path of the PON system by transmitting monitoring light having a certain wavelength along the transmission path of the PON system and monitoring reflected light of the monitoring light is known.

SUMMARY

According to an aspect of the invention, an apparatus provided between an optical line terminal (OLT) and an optical network unit (ONU), the amplification apparatus includes: a circulator configured to output light incident on a first terminal from a second terminal, light incident on the second terminal from a third terminal, light incident on the third terminal from a fourth terminal, and light incident on the fourth terminal from the first terminal and to receive, at the first terminal, first signal light transmitted from the OLT to the ONU and first light having a predetermined wavelength different from a wavelength of the first signal light and, at the third terminal, second signal light transmitted from the ONU to the OLT and second light having the predetermined wavelength; a first reflector configured to reflect the light output from the second terminal and to output the reflected light back to the second terminal; a first optical amplifier configured to be provided between the second terminal and the first reflector and to have an amplification band characteristic of amplifying at least the first signal light; a second reflector configured to reflect the light output from the fourth terminal and to output the reflected light back to the fourth terminal; a second optical amplifier configured to be provided between the fourth terminal and the second reflector and to have an amplification band characteristic of amplifying the second signal light without amplifying the second light having the predetermined wavelength; and a first partial reflector configured to have a wavelength transmission characteristic of propagating, in the light output from the fourth terminal, light having a wavelength different from the predetermined wavelength and outputting the light having the wavelength different from the predetermined wavelength to the second optical amplifier while reflecting the second light having the predetermined wavelength and outputting the second light back to the fourth terminal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a first diagram illustrating an example of an optical pulse waveform monitored by a monitoring system;

FIG. 6 is a second diagram illustrating an example of the optical pulse waveform monitored by the monitoring system;

DESCRIPTION OF EMBODIMENTS

When an amplification apparatus that amplifies signal light transmitted in a single-fiber bidirectional manner is provided in a PON system, reflected light of monitoring light having a certain wavelength might be blocked by the amplification apparatus and might not return even if the monitoring light is output along a transmission path. Therefore, there has been a problem in that it is difficult to detect a failure in the transmission path of the PON system whose transmission path is provided with the amplification apparatus.

The embodiment provides an amplification apparatus and a communication system which enable detection of a failure in a transmission path. The amplification apparatus and the communication system will be described in detail hereinafter with reference to the accompanying drawings.

Amplification Apparatus

Figure 1A:
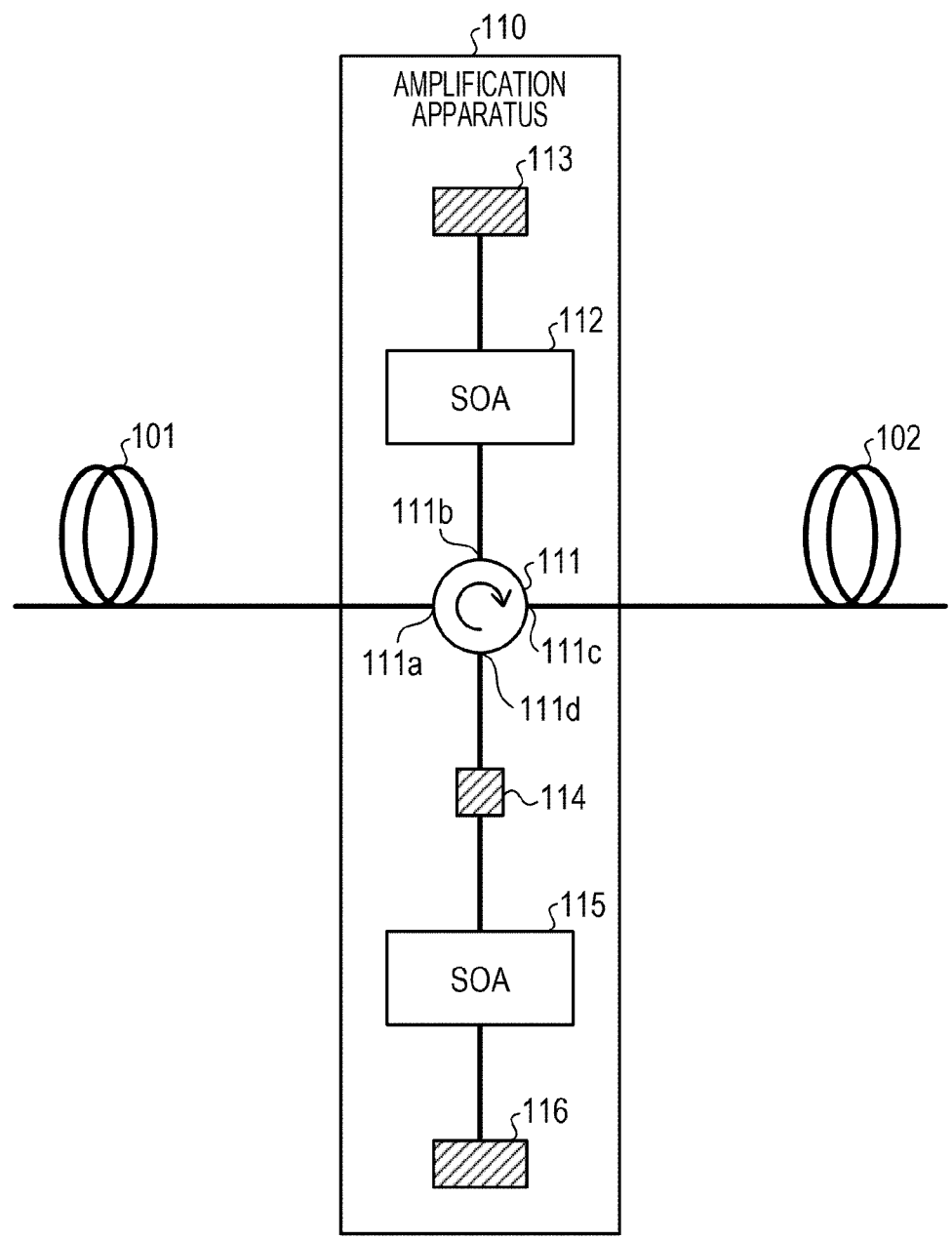
FIG. 1A is a diagram illustrating an example of an amplification apparatus according to an embodiment.
Figure 1B:
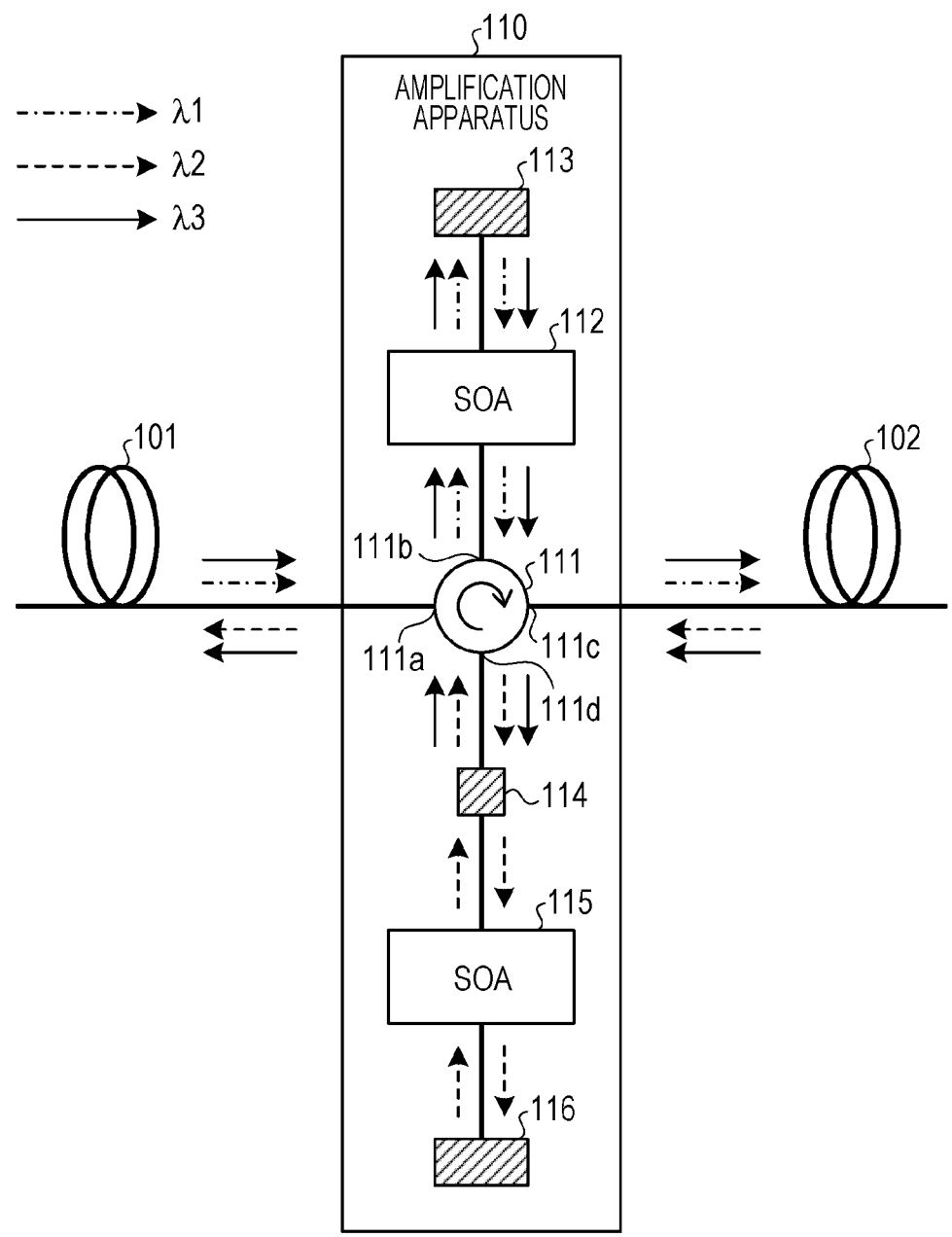
FIG. 1B is a diagram illustrating an example of traveling directions of light in the amplification apparatus illustrated in FIG. 1A.

FIG. 1A is a diagram illustrating an example of the amplification apparatus according to the embodiment. FIG. 1B is an example of traveling directions of light in the amplification apparatus illustrated in FIG. 1A. In FIG. 1B, solid-line arrows indicate the traveling directions of a light beam having a wavelength $\lambda 3$, broken-line arrows indicate the traveling directions of a light beam having a wavelength $\lambda 2$, and dash-dot-line arrows indicate the traveling directions of a light beam having a wavelength $\lambda 1$.

An amplification apparatus 110 outputs the light beams having the wavelength $\lambda 1$ and $\lambda 3$, respectively, input from a transmission path 101 to a transmission path 102 while amplifying at least either the light beam having the wavelength $\lambda 1$ or the light beam having the wavelength $\lambda 3$ to be output. In addition, the amplification apparatus 110 outputs the light beams having the wavelengths $\lambda 2$ and $\lambda 3$, respectively, input from the transmission path 102 to the transmission path 101 while amplifying the light beam having the wavelength $\lambda 2$ to be output.

The transmission paths 101 and 102 are single-fiber bidirectional transmission paths through which the light beams having the wavelengths $\lambda 1$ and $\lambda 3$, respectively, and the light beams having the wavelengths $\lambda 2$ and $\lambda 3$, respectively, are transmitted in opposite directions. The transmission path 101 is, for example, an optical fiber connecting an OLT and the amplification apparatus 110 to each other, and the transmission path 102 is an optical fiber connecting the amplification apparatus 110 and an ONU to each other. A system in which an OLT and an ONU are connected by optical fibers and optical signals are transmitted through a single optical fiber in a bidirectional manner as described above is called a "single-fiber bidirectional optical transmission system".

The amplification apparatus 110 is used in a single-fiber bidirectional optical transmission system, and amplifies the light beams transmitted through the transmission paths 101 and 102 in a bidirectional manner. The wavelengths $\lambda 1$ to $\lambda 3$ are different from one another. For example, the wavelength $\lambda 1$ is 1.49 [μm], the wavelength $\lambda 2$ is 1.3 [μm], and the wavelength $\lambda 3$ is 1.61 [μm].

The amplification apparatus 110 includes a circulator 111, a semiconductor optical amplifier (SOA) 112, a first reflector 113, a partial reflector 114, an SOA 115, and a second reflector 116.

The circulator 111 includes a first terminal 111a, a second terminal 111b, a third terminal 111c, and a fourth terminal 111d. The circulator 111 outputs light incident on the first terminal 111a from the second terminal 111b. The circulator 111 outputs light incident on the second terminal 111b from the third terminal 111c. The circulator 111 outputs light incident on the third terminal 111c from the fourth terminal 111d. The circulator 111 outputs light incident on the fourth terminal 111d from the first terminal 111a.

The light beams having the wavelengths $\lambda 1$ and $\lambda 3$, respectively, input from the transmission path 101 are incident on the first terminal 111a of the circulator 111. The light beams having the wavelengths $\lambda 2$ and $\lambda 3$, respectively, input from the transmission path 102 are incident on the third terminal 111c of the circulator 111.

The circulator 111 outputs, from the second terminal 111b to the SOA 112, the light beams having the wavelengths $\lambda 1$ and $\lambda 3$, respectively, incident on the first terminal 111a. The circulator 111 outputs, from the third terminal 111c to the transmission path 102, the light beams having the wavelengths $\lambda 1$ and $\lambda 3$, respectively, input from the SOA 112 and incident on the second terminal 111b.

The circulator 111 outputs the light beams having the wavelengths $\lambda 2$ and $\lambda 3$, respectively, input from the transmission path 102 to the partial reflector 114. The circulator 111 outputs the light beams having the wavelengths $\lambda 2$ and $\lambda 3$, respectively, input from the partial reflector 114 to the transmission path 101.

The SOA 112 is provided between the second terminal 111b of the circulator 111 and the first reflector 113, and has an amplification band characteristic of amplifying at least the light beam having the wavelength $\lambda 1$. In the example illustrated in FIGS. 1A and 1B, the SOA 112 amplifies the light beams having the wavelength $\lambda 1$ and $\lambda 3$, respectively, input from the circulator 111 and outputs the light beams having the wavelengths $\lambda 1$ and $\lambda 3$, respectively, to the first reflector 113. In addition, the SOA 112 amplifies the light beams having the wavelengths $\lambda 1$ and $\lambda 3$, respectively, input from the first reflector 113 and outputs the light beams having the wavelengths $\lambda 1$ and $\lambda 3$, respectively, to the circulator 111. The amplification band of the SOA 112 includes, for example, the wavelengths $\lambda 1$ and $\lambda 3$.

Thus, by providing the SOA 112 between the second terminal 111b of the circulator 111 and the first reflector 113 and amplifying the light beams passing through the SOA 112 in a bidirectional manner, the light beams may be efficiently amplified. An optical amplifier provided between the second terminal 111b of the circulator 111 and the first reflector 113 is not limited to the SOA 112, and another optical amplifier capable of amplifying light beams passing therethrough in a bidirectional manner may be used, instead.

The first reflector 113 reflects the light beams having the wavelengths $\lambda 1$ and $\lambda 3$, respectively, output from the SOA 112 and outputs the light beams having the wavelengths $\lambda 1$ and $\lambda 3$, respectively, back to the SOA 112. Therefore, the light beams output from the second terminal 111b of the circulator 111 may be reflected and incident on the second terminal 111b of the circulator 111. As the first reflector 113, one of various reflectors including a reflection member such as a metal and a fiber mirror may be used. Alternatively, an optical device having optical filter characteristics obtained by using a dielectric multilayer film or the like may be used as the first reflector 113 (for example, refer to FIG. 7).

Accordingly, the light beams having the wavelengths $\lambda 1$ and $\lambda 3$, respectively, may pass through the SOA 112 twice. Therefore, the light beams having the wavelengths $\lambda 1$ and $\lambda 3$, respectively, input from the transmission path 101 to the amplification apparatus 110 may be amplified and output to the transmission path 102.

With respect to the light beams having the wavelengths $\lambda 2$ and $\lambda 3$, respectively, output from the circulator 111, the partial reflector 114 reflects the light beam having the wavelength $\lambda 3$ and outputs the light beam having the wavelength $\lambda 3$ back to the circulator 111 while propagating the light beam having the wavelength $\lambda 2$ and outputting the light beam having the wavelength $\lambda 2$ to the SOA 115. The partial reflector 114 may be, for example, realized by an optical device having optical filter characteristics obtained by using a dielectric multilayer film, an etalon optical filter, a fiber grating, or the like.

The SOA 115 is provided between the fourth terminal 111d of the circulator 111 and the second reflector 116, and has an amplification band characteristic of amplifying the light beam having the wavelength $\lambda 2$ without amplifying the light beam having the wavelength $\lambda 3$. In the example illustrated in FIGS. 1A and 1B, the SOA 115 amplifies the light beam having the wavelength $\lambda 2$ input from the partial reflector 114 and outputs the light beam having the wavelength $\lambda 2$ to the second reflector 116. In addition, the SOA 115 amplifies the light beam having the wavelength $\lambda 2$ input from the second reflector 116 and outputs the light beam having the wavelength $\lambda 2$ to the partial reflector 114.

Thus, by providing the SOA 115 between the fourth terminal 111d of the circulator 111 and the second reflector 116 and amplifying the light beams passing through the SOA 115 in a bidirectional manner, the light beams may be efficiently amplified. An optical amplifier provided between the fourth terminal 111d of the circulator 111 and the second reflector 116 is not limited to the SOA 115, and another optical amplifier capable of amplifying light beams passing therethrough in a bidirectional manner may be used, instead.

The second reflector 116 reflects the light beam having the wavelength λ2 output from the SOA 115 and outputs the light beam having the wavelength λ2 back to the SOA 115. Thus, the light beam output from the fourth terminal 111d of the circulator 111 is reflected and incident on the fourth terminal 111d of the circulator 111. As the second reflector 116, one of various reflectors including a reflection member such a metal and a fiber mirror may be used. Alternatively, an optical device having optical filter characteristics obtained by using a dielectric multilayer film may be used as the second reflector 116 (for example, refer to FIG. 8).

Accordingly, the light beam having the wavelength λ3 may pass through the SOA 112 twice and may be kept from passing through the SOA 115. Therefore, the light beam having the wavelength λ3 input from the transmission path 101 to the amplification apparatus 110 may be amplified and output to the transmission path 102. In addition, even if the wavelength λ3 is out of the amplification range of the SOA 115, the light beam having the wavelength λ3 input from the transmission path 101 to the amplification apparatus 110 may pass through the amplification apparatus 110 and may be output to the transmission path 102.

As described above, according to the amplification apparatus 110, the light beams having the wavelengths λ1 and λ2, respectively, that pass through the amplification apparatus 110 in a bidirectional manner may be efficiently amplified. By providing the partial reflector 114 between the circulator 111 and the SOA 115, the light beam having the wavelength λ3 input from the transmission path 101 to the amplification apparatus 110 may pass through the amplification apparatus 110 and may be output to the transmission path 102 even if the wavelength λ3 is out of the amplification range of the SOA 115.

For example, the amplification apparatus 110 may be provided between an OLT and an ONU connected to each other through a splitter. The wavelength λ1 may be used for downstream signal light transmitted from the OLT to the ONU, the wavelength λ2 may be used for upstream signal light transmitted from the ONU to the OLT, and the wavelength λ3 may be used for monitoring light transmitted from the side of the OLT to the side of the ONU.

In doing so, the amplification apparatus 110 may efficiently amplify the upstream signal light and the downstream signal light transmitted in a single-fiber bidirectional manner and may propagate reflected light of the monitoring light from the side of the ONU to the side of the OLT. Therefore, failures in the transmission path may be detected in a PON system whose transmission path is provided with the amplification apparatus 110.

The light beams output from the SOA 112 to the circulator 111 are output to the transmission path 102 by the circulator 111. Therefore, even if isolators are not provided at both ends of the SOA 112, return of light to the transmission path 101 caused by end reflection of the SOA 112 or the like may be suppressed. In addition, even if isolators are not provided at both ends of the SOA 112, unstable operation (oscillation or the like) of the SOA 112 may be suppressed, thereby stabilizing the operation of the SOA 112. Therefore, the amplification apparatus 110 may be reduced in size.

The light beams output from the SOA 115 to the circulator 111 are output to the transmission path 101 by the circulator 111. Therefore, even if isolators are not provided at both ends of the SOA 115, return of light to the transmission path 102 caused by end reflection of the SOA 115 or the like may be suppressed. In addition, even if isolators are not provided at both ends of the SOA 115, the oscillation of the SOA 115 may be suppressed, thereby stabilizing the operation of the SOA 115. Therefore, the amplification apparatus 110 may be reduced in size.

In addition, for example, even if a configuration in which wavelength components are separated from one another by an optical multi/demultiplexer is not adopted, the light beams having the wavelengths λ1 and λ2, respectively, passing through the amplification apparatus 110 in a bidirectional manner may be amplified while propagating the light beam having the wavelength λ3 input from the transmission path 101 and outputting the light beam having the wavelength λ3 to the transmission path 102. Therefore, the configuration of the amplification apparatus 110 may be simplified.

Wavelength Transmission Characteristic Line of Partial Reflector

Figure 2:
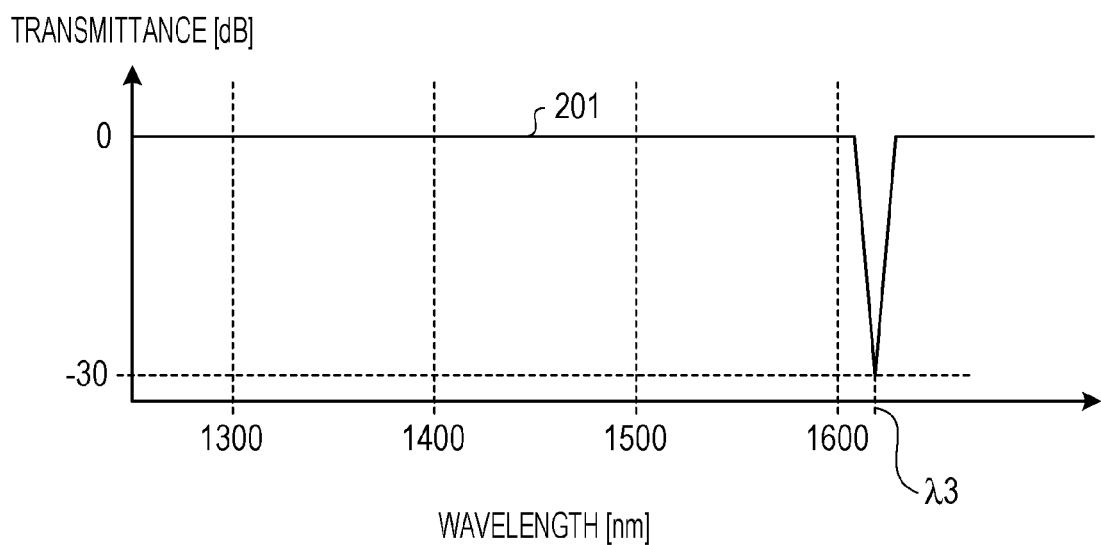
FIG. 2 is a diagram illustrating an example of a wavelength transmission characteristic line of a partial reflector.

FIG. 2 is a diagram illustrating an example of a wavelength transmission characteristic line of the partial reflector 114. In FIG. 2, the horizontal axis represents wavelength [nm], and the vertical axis represents transmittance [dB]. A wavelength transmission characteristic line 201 is a line indicating the characteristics of the transmittance of the partial reflector 114 relative to the wavelength. As indicated by the wavelength transmission characteristic line 201, the transmittance of the partial reflector 114 is low at the wavelength λ3 (for example, 1.61 [μm]) and high at wavelengths other than the wavelength λ3.

In the example illustrated in FIG. 2, the transmittance of the partial reflector 114 is about −30 [dB] at the wavelength λ3 and about 0 [dB] at wavelengths other than the wavelength λ3. Therefore, with respect to the light beams having the wavelengths λ2 and λ3, respectively, output from the circulator 111, the light beam having the wavelength λ3 may be reflected and output back to the circulator 111, and the light beam having the wavelength λ2 may pass through the partial reflector 114 and may be output to the SOA 115.

Communication System Adopting Amplification Apparatus

Figure 3:
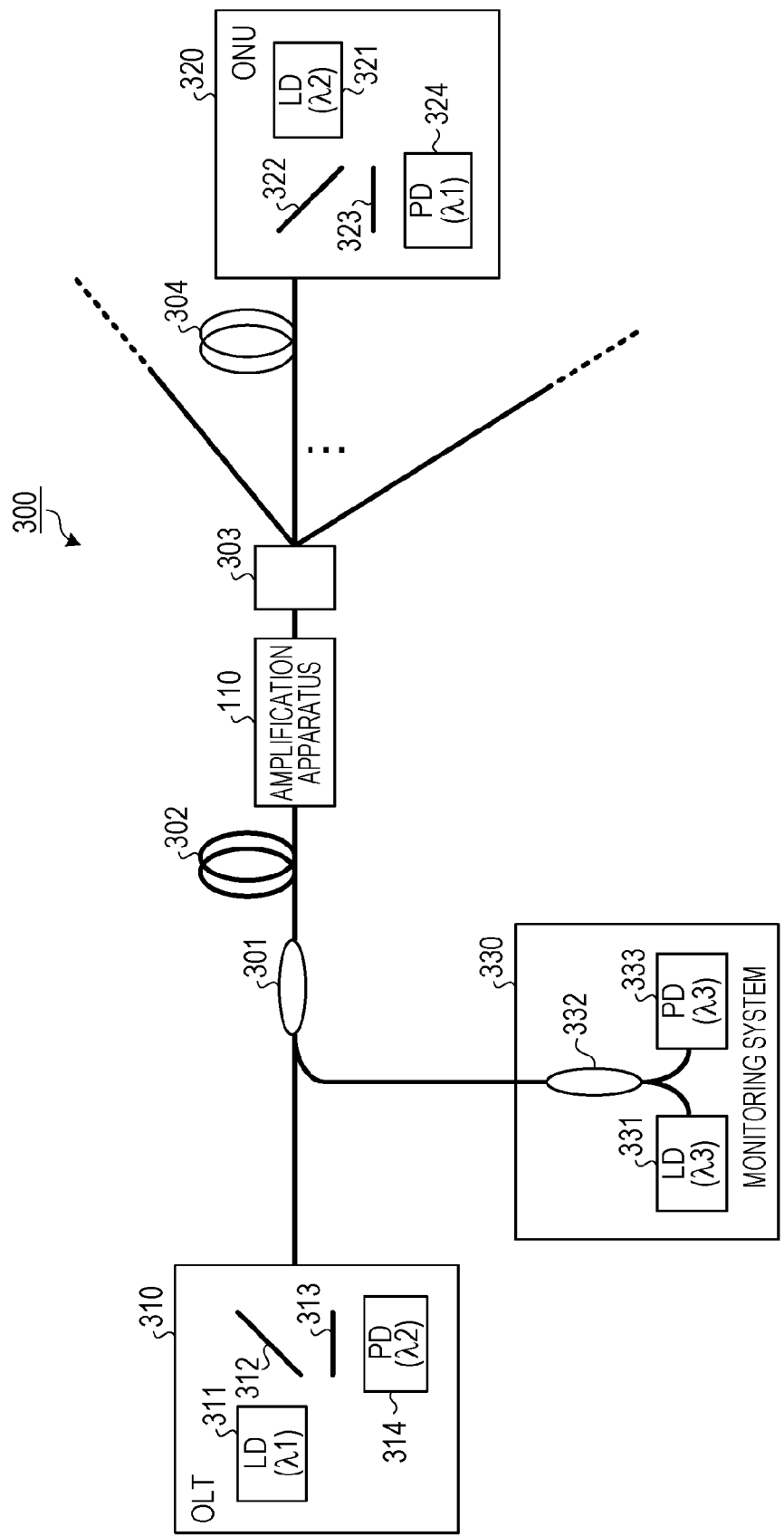
FIG. 3 is a diagram illustrating an example of a communication system adopting the amplification apparatus.

FIG. 3 is a diagram illustrating an example of a communication system adopting an amplification apparatus 110. A communication system 300 illustrated in FIG. 3 is a PON system in which an OLT and a plurality of ONUs are connected to each other by a coupler. In the example illustrated in FIG. 3, the communication system 300 includes an OLT 310, an ONU 320, a monitoring system 330, a wavelength-division multiplexing (WDM) coupler 301, a transmission path 302, the amplification apparatus 110, a splitter 303, and a transmission path 304.

The OLT 310 includes a laser diode (LD) 311, optical filters 312 and 313, and a photodiode (PD) 314. The LD 311 generates downstream signal light having the wavelength λ1 and outputs the downstream signal light having the wavelength λ1 to the optical filter 312. The optical filter 312 outputs, from the OLT 310, the downstream signal light having the wavelength λ1 input from the LD 311. The optical filter 312 outputs light having wavelengths other than the wavelength λ1 incident on the OLT 310 to the optical filter 313.

The optical filter 313 extracts upstream signal light having the wavelength λ2 from the light input from the optical filter 312 and outputs the extracted upstream signal light having the wavelength λ2 to the PD 314. The PD 314 receives the upstream signal light having the wavelength λ2 output from the optical filter 313. The PD 314 outputs the received upstream signal light.

The WDM coupler 301 multiplexes the downstream signal light having the wavelength λ1 input from the OLT 310 and monitoring light having the wavelength λ3 input from the monitoring system 330. The WDM coupler 301 then outputs the multiplexed light to the amplification apparatus 110 through the transmission path 302.

In addition, the WDM coupler 301 performs wavelength demultiplexing on light input from the amplification apparatus 110 through the transmission path 302. The WDM coupler 301 then outputs upstream signal light having the wavelength λ2 obtained as a result of the wavelength demultiplexing to the OLT 310. The WDM coupler 301 also outputs reflected light of the monitoring light having the wavelength λ3 obtained as a result of the wavelength demultiplexing to the monitoring system 330.

The amplification apparatus 110 is, for example, the amplification apparatus 110 illustrated in FIGS. 1A and 1B. The amplification apparatus 110 amplifies the downstream signal light having the wavelength λ1 and the monitoring light having the wavelength λ3 input from the WDM coupler 301 through the transmission path 302, and outputs the amplified downstream signal light having the wavelength λ1 and the amplified monitoring light having the wavelength λ3 to the splitter 303. In addition, the amplification apparatus 110 amplifies light output from the splitter 303. The amplification apparatus 110 then outputs the amplified light to the WDM coupler 301 through the transmission path 302.

The splitter 303 divides the light output from the amplification apparatus 110 into N light beams (N=2, 3, 4, . . . ) and outputs the N light beams to N paths, respectively. In addition, the splitter 303 multiplexes light beams output from the N paths and outputs the multiplexed light beams to the amplification apparatus 110. For example, the light beams from the N paths include upstream signal light beams having the wavelength λ2 and the reflected light beams of the monitoring light having the wavelength λ3 from the plurality of ONUs including the ONU 320. The upstream signal light beams included in the light beams from the N paths are obtained at different timings. Therefore, the upstream signal light beams from the N paths may be transmitted using optical time-division multiplexing (OTDM).

The transmission path 304 and the ONU 320 are connected to one of the N paths extending from the splitter 303. The transmission path 304 inputs light output from the splitter 303 to the ONU 320. In addition, the transmission path 304 inputs light output from the ONU 320 to the splitter 303.

The ONU 320 includes an LD 321, optical filters 322 and 323, and a PD 324. The LD 321 generates upstream signal light having the wavelength λ2 and outputs the upstream signal light having the wavelength λ2 to the optical filter 322. The optical filter 322 outputs, from the ONU 320, the upstream signal light having the wavelength λ2 input from the LD 321. In addition, the optical filter 322 outputs light having wavelengths other than the wavelength λ2 incident on the ONU 320 to the optical filter 323.

The optical filter 323 extracts downstream signal light having the wavelength λ1 from the light output from the optical filter 322, and outputs the extracted downstream signal light having the wavelength λ1 to the PD 324. The PD 324 receives the downstream signal light having the wavelength λ1 output from the PD 324. The PD 324 outputs the received downstream signal light.

The monitoring system 330 includes an LD 331, a coupler 332, and a PD 333. The LD 331 generates the monitoring light having the wavelength λ3 and outputs the monitoring light having the wavelength λ3 to the coupler 332. The monitoring light is, for example, pulse light. The coupler 332 outputs, to the WDM coupler 301, the monitoring light having the wavelength λ3 input from the LD 331. In addition, the coupler 332 divides the reflected light beams of the monitoring light having the wavelength λ3 input from the WDM coupler 301 and outputs the divided reflected light of the monitoring light having the wavelength λ3 to the LD 331 and the PD 333. The PD 333 receives the reflected light of the monitoring light having the wavelength λ3 output from the coupler 332. The PD 333 then outputs a result of the reception of the reflected light of the monitoring light.

The monitoring light output from the LD 331 and then output from the monitoring system 330 is transmitted to the side of the plurality of ONUs including the ONU 320. Part of the monitoring light is reflected at each portion of paths through which the monitoring light passes, and reflected light returns to the monitoring system 330 and is then received by the PD 333. Portions at which part of the monitoring light is reflected include, for example, a connection between optical parts, and a disconnected portion of an optical fiber. The time taken for reflected light of the monitoring light to be received by the PD 333 since the monitoring light is output from the LD 331 varies depending on the distance between the LD 331 and a portion at which part of the monitoring light is reflected.

Therefore, the monitoring system 330 may estimate the distance between the monitoring system 330 and a portion at which part of the monitoring light is reflected by monitoring time-series results (optical pulse waveforms) of reception of reflected light output from the PD 333. In addition, by obtaining the time-series results of reception of reflected light output from the PD 333 and comparing the time-series results of reception at different times, the monitoring system 330 may monitor changes in a portion at which part of the monitoring light is reflected. Therefore, failures in the transmission paths such as a disconnection of an optical fiber may be detected.

In addition, by providing the amplification apparatus 110 between the OLT 310 and the splitter 303, the downstream signal light from the OLT 310 and the upstream signal light from the plurality of ONUs including the ONU 320 may be collectively amplified. However, the position at which the amplification apparatus 110 is provided is not limited to the position between the OLT 310 and the splitter 303, and, for example, may be a position between the splitter 303 and the ONU 320, instead. In this case, too, the downstream signal light from the OLT 310 and the upstream signal light from the ONU 320 may be amplified.

For example, when the amplification apparatus 110 is provided at a position close to a transmitter such as the OLT 310 or the ONU 320, an upper limit value of transmission optical power might be limited or it might be difficult to obtain satisfactory amplification characteristics due to a nonlinear effect of an optical fiber transmission path. Adverse effects on transmission quality include, for example, increases in a pattern effect and a noise factor. In addition, when the amplification apparatus 110 is to be provided on the side of the plurality of ONUs, the same number of amplification apparatuses 110 as the number of the plurality of ONUs have to be provided, which increases cost.

On the other hand, when the amplification apparatus 110 is provided at a position close to a receiver such as the OLT 310 or the ONU 320, reception characteristics deteriorate due to noise light generated by the amplification apparatus 110. In addition, when the amplification apparatus 110 is to be provided on the side of the plurality of ONUs, the same number of amplification apparatuses 110 as the number of the plurality of ONUs have to be provided, which increases cost.

Therefore, the amplification apparatus 110 may be provided at a relay point between the OLT 310 and the ONU 320. In doing so, the amplification apparatus 110 may be provided at a position away from the OLT 310 and the ONU 320, and the level of transmission light input to the amplification apparatus 110 becomes relatively low. Accordingly, light may be efficiently amplified.

In addition, by providing the amplification apparatus 110 between the OLT 310 and the splitter 303, the light beams corresponding to the plurality of ONUs may be collectively amplified. In addition, even if the number of ONUs has been increased in the communication system 300, the amplification apparatus 110 may amplify light output from new ONUs without adding a new amplification apparatus.

Wavelength Bands Used in Communication System

Figure 4:
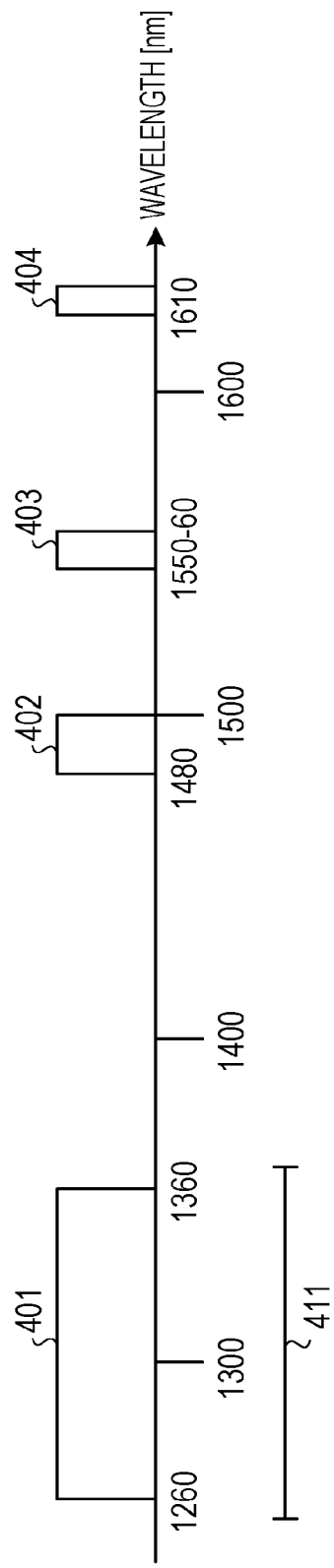
FIG. 4 is a diagram illustrating an example of wavelength bands used in the communication system.

FIG. 4 is a diagram illustrating an example of wavelength bands used in the communication system 300. In FIG. 4, the horizontal axis represents wavelength. When the communication system 300 illustrated in FIG. 3 is a gigabit Ethernet (registered trademark) PON (GE-PON) of 1 Gbps, for example, wavelength bands 401 to 404 are used in the communication system 300.

The wavelength band 401 is a band used for upstream transmission from the ONU 320 to the OLT 310 and corresponds to the wavelength $\lambda 2$. The wavelength band 402 is a band used for downstream transmission from the OLT 310 to the ONU 320 and corresponds to the wavelength $\lambda 1$. The wavelength band 403 is a band used for video signals transmitted from the OLT 310 to the ONU 320 and corresponds to the wavelength M. The wavelength band 404 is a band used for the monitoring light that is output from the monitoring system 330 and whose reflected light is monitored by the monitoring system 330, and corresponds to the wavelength $\lambda 3$.

The amplification band of the SOA 115 illustrated in FIGS. 1A and 1B is, for example, an amplification band 411 including the wavelength band 401. As illustrated in FIG. 4, the wavelength band 401 (wavelength $\lambda 2$) for upstream signal light is relatively distant from the wavelength band 404 (wavelength $\lambda 3$) for the monitoring light, and therefore it is difficult for the amplification band 411 to include both the wavelength bands 401 and 404. On the other hand, according to the amplification apparatus 110, even if the width of the amplification band 411 is about 100 [μm] and the amplification band 411 does not include the wavelength band 404, the reflected light of the monitoring light may pass through the amplification apparatus 110.

Optical Pulse Waveform Monitored by Monitoring System

FIGS. 5 and 6 are diagrams illustrating examples of an optical pulse waveform monitored by the monitoring system 330. In FIGS. 5 and 6, the horizontal axis represents the distance between the OLT 310 and the ONU 320, and the vertical axis represents a result (optical power level) of reception of the reflected light of the monitoring light by the PD 333 of the monitoring system 330.

An optical pulse waveform 501 illustrated in FIG. 5 is an optical pulse waveform observed by the monitoring system 330 before a failure such as a disconnection of an optical fiber occurs in the communication system 300. More specifically, the monitoring system 330 obtains optical power levels indicated by results of reception of the reflected light by the PD 333 in a time series, and plots the obtained optical power levels against a distance corresponding to time, in order to obtain the optical pulse waveform 501.

A distance L [m] of an optical power level corresponding to time may be, for example, calculated using an expression C [m/s]×t [s]/2N. C denotes the speed of light in vacuum. N denotes the refractive index of a core of an optical transmission path. t denotes the time taken for the reflected light to return since the monitoring light is output.

The inclination of the optical pulse waveform 501 indicates the optical loss of the monitoring light. Therefore, a distance corresponding to a point at which the inclination of the optical pulse waveform 501 is large indicates a distance from a point at which the monitoring light is output to a point at which the optical loss is large. For example, distances L1 to L3 indicate distances from the point at which the monitoring light is output to three ONUs, respectively, including the ONU 320 in the communication system 300.

An optical pulse waveform 601 illustrated in FIG. 6 is an optical pulse waveform observed by the monitoring system 330 after a failure such as a disconnection of an optical fiber occurs in the communication system 300. An optical pulse waveform 501 illustrated in FIG. 6 is the optical pulse waveform 501 illustrated in FIG. 5 used as a reference. In the optical pulse waveform 601, there is a portion at a distance L4 shorter than the distances L1 to L3 in which the inclination of the optical pulse waveform 601 significantly changes.

When a failure such as a disconnection of an optical fiber has occurred in the communication system 300, the monitoring light is Fresnel reflected at a point at which the failure has occurred. That is, the distance L4 indicates a distance from the point at which the monitoring light is output to the point at which the failure such as a disconnection of an optical fiber has occurred in the communication system 300. Therefore, by comparing the optical pulse waveforms 501 and 601 and identifying the distance L4, the point at which the failure such as a disconnection of an optical fiber has occurred may be identified in the communication system 300.

Wavelength Transmission Characteristic Line of First Reflector

Figure 7:
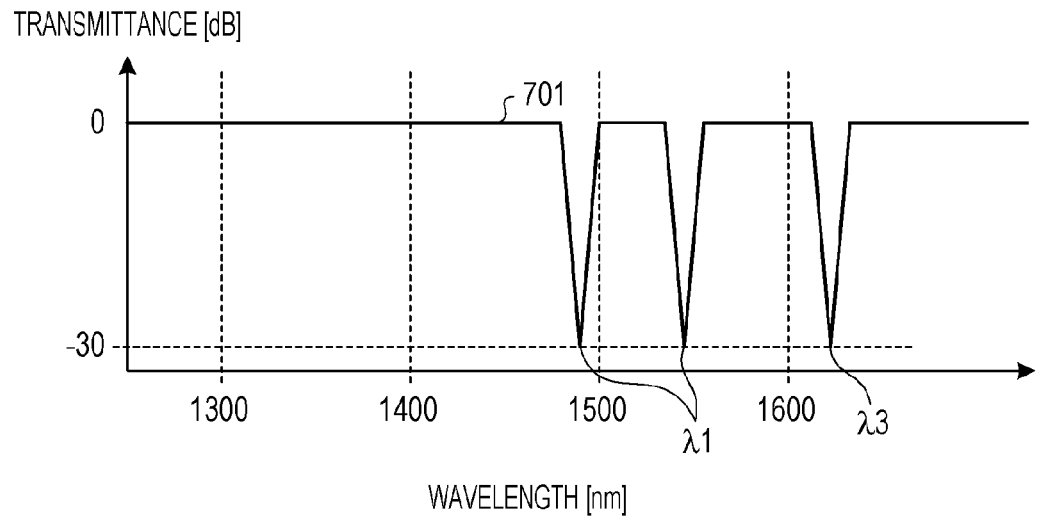
FIG. 7 is a diagram illustrating an example of a wavelength transmission characteristic line of a first reflector.

FIG. 7 is a diagram illustrating an example of a wavelength transmission characteristic line of the first reflector 113. In FIG. 7, the horizontal axis represents wavelength [nm], and the vertical axis represents transmittance [dB]. A wavelength transmission characteristic line 701 is a line indicating the transmittance of the first reflector 113 relative to the wavelength. As indicated by the wavelength transmission characteristic line 701, the transmittance of the first reflector 113 is low at the wavelengths $\lambda 3$ (for example, 1.61 [μm]) and $\lambda 1$ (for example, 1.49 [μm] and 1.55 [μm]) and high at wavelengths other than the wavelengths $\lambda 1$ and $\lambda 3$.

In the example illustrated in FIG. 7, the transmittance of the first reflector 113 is about −30 [dB] at the wavelengths $\lambda 1$ and $\lambda 3$ and about 0 [dB] at the wavelengths other than the wavelengths $\lambda 1$ and $\lambda 3$. Therefore, with respect to the light output from the SOA 112, the light beams having the wavelengths $\lambda 1$ and $\lambda 3$, respectively, may be reflected and output back to the SOA 112, and wavelength components other than the wavelengths $\lambda 1$ and $\lambda 3$ may be kept from being output to the SOA 112.

Thus, the first reflector 113 may be realized by an optical filter having wavelength transmission characteristics in which reflectivity in a wavelength band that includes the wavelengths of the monitoring light and the signal light is higher than reflectivity at the other wavelength band. Accordingly, even if an optical filter having a wavelength transmission characteristic of reflecting only the monitoring light and the signal light is not separately provided, light other than the monitoring light and the signal light may pass through the first reflector 113. For example, the light that has passed through the first reflector 113 turns into heat and disappears.

Therefore, for example, noise components such as amplified spontaneous emission (ASE) generated in the SOA 112 or the like may be removed. In addition, light crosstalk may be avoided by removing leakage of light input from the transmission path 102 to the amplification apparatus 110, which stabilizes the operation of the SOA 112.

Wavelength Transmission Characteristic Line of Second Reflector

Figure 8:
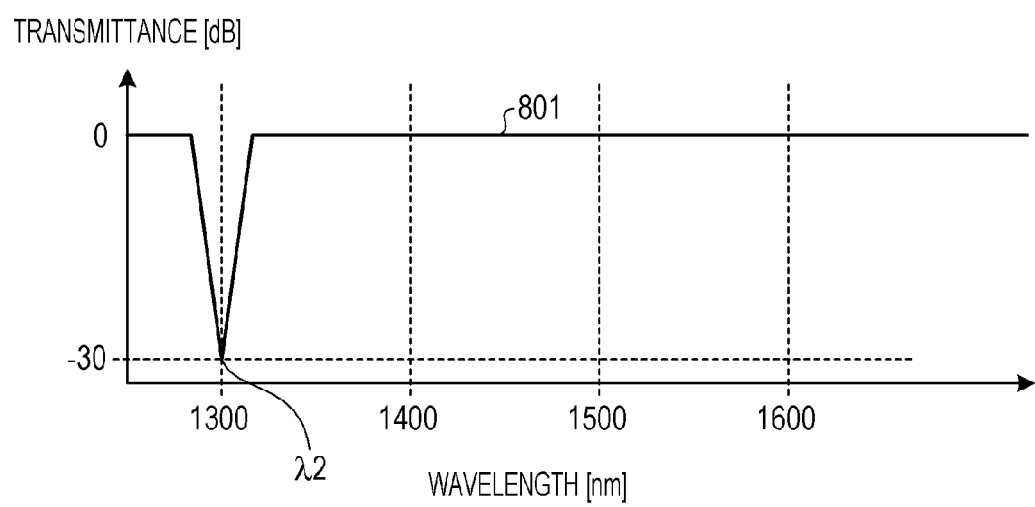
FIG. 8 is a diagram illustrating an example of a wavelength transmission characteristic line of a second reflector.

FIG. 8 is a diagram illustrating an example of a wavelength transmission characteristic line of the second reflector 116. In FIG. 8, the horizontal axis represents wavelength [nm], and the vertical axis represents transmittance [dB]. A wavelength transmission characteristic line 801 is a line indicating the transmittance of the second reflector 116 relative to the wavelength. As indicated by the wavelength transmission characteristic line 801, the transmittance of the second reflector 116 is low at the wavelength $\lambda 2$ (for example, 1.3 [μm]) and high at wavelengths other than the wavelength $\lambda 2$.

In the example illustrated in FIG. 8, the transmittance of the second reflector 116 is about −30 [dB] at the wavelength $\lambda 2$ and about 0 [dB] at the wavelengths other than the wavelength $\lambda 2$. Therefore, with respect to the light output from the SOA 115, the light beam having the wavelength $\lambda 2$ may be reflected and output back to the SOA 115, and wavelength components other than the wavelength $\lambda 2$ may be kept from being output to the SOA 115.

Thus, the second reflector 116 may be realized by an optical filter having wavelength transmission characteristics in which reflectivity in the wavelength band of the signal light is higher than reflectivity in the other wavelength bands. Accordingly, even if an optical filter having a wavelength transmission characteristic of reflecting only the signal light is not separately provided, light other than the signal light may pass through the second reflector 116. For example, the light that has passed through the second reflector 116 turns into heat and disappears.

Therefore, for example, noise components such as ASE generated in the SOA 115 or the like may be removed. In addition, light crosstalk may be avoided by removing leakage of light input from the transmission path 101 to the amplification apparatus 110, which stabilizes the operation of the SOA 115.

Configuration of First and Second Reflectors

Figure 9:
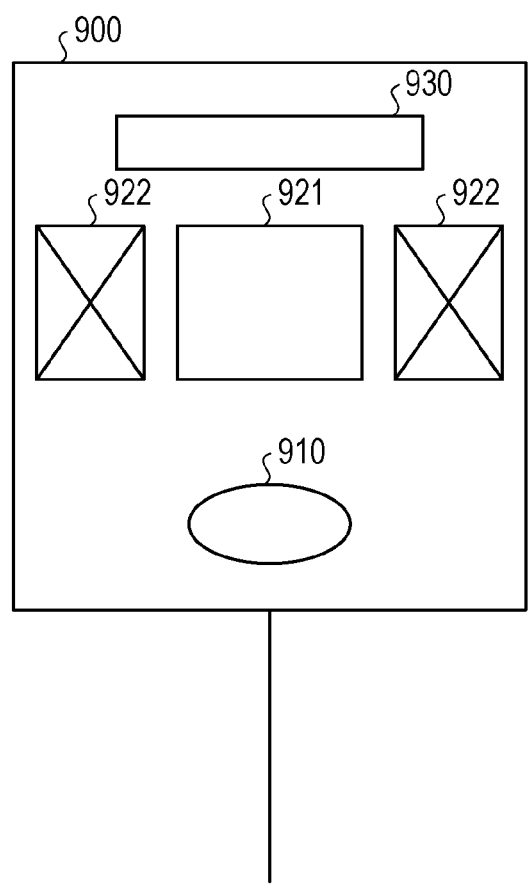
FIG. 9 is a diagram illustrating an example of the configuration of the first reflector and the second reflector.

FIG. 9 is a diagram illustrating an example of the configuration of the first reflector 113 and the second reflector 116. Each of the first reflector 113 and the second reflector 116 illustrated in FIGS. 1 and 2 may be realized, for example, by a reflector 900 illustrated in FIG. 9. The reflector 900 includes a lens 910, a Faraday rotator 921, a magnet 922, and a reflection body 930. The lens 910 outputs light incident on the reflector 900 to the Faraday rotator 921. In addition, the lens 910 outputs, from the reflector 900, light input from the Faraday rotator 921.

The Faraday rotator 921 is surrounded by, for example, the annular magnet 922. The Faraday rotator 921 rotates the polarization direction of the light input from the lens 910 by 45 degrees, and outputs the light whose polarization direction has been rotated to the reflection body 930. In addition, the Faraday rotator 921 rotates the polarization direction of light reflected and input from the reflection body 930 by 45 degrees, and outputs the light whose polarization direction has been rotated to the lens 910.

The reflection body 930 reflects the light output from the Faraday rotator 921 and outputs the light to the Faraday rotator 921. As the reflection body 930, for example, a reflection member having the wavelength transmission characteristic line 701 illustrated in FIG. 7 such as a dielectric multilayer film may be used. Alternatively, for example, a total reflection mirror that reflects light at all wavelengths or the like may be used as the reflection body 930.

Therefore, the light incident on the reflector 900 may be reflected and output while rotating the polarization direction of the light by 90 degrees. For example, when the reflector 900 is adopted as the first reflector 113, the polarization directions of the light beams having the wavelengths $\lambda 1$ and $\lambda 3$, respectively, that have passed through the SOA 112 may be rotated by 90 degrees, and the light beams having the wavelengths $\lambda 1$ and $\lambda 3$, respectively, may pass through the SOA 112 again. Accordingly, the polarization dependence of the SOA 112 may be cancelled, thereby reducing the polarization dependence of the amplification apparatus 110.

When the reflector 900 is adopted as the second reflector 116, the polarization direction of the light beam having the wavelength $\lambda 2$ that has passed through the SOA 115 may be rotated by 90 degrees, and the light beam having the wavelength $\lambda 2$ may pass through the SOA 115 again. Accordingly, the polarization dependence of the SOA 115 may be cancelled, thereby reducing the polarization dependence of the amplification apparatus 110.

Thus, by providing the Faraday rotator 921 that propagates the light going back and forth between the SOA 112 and the first reflector 113 in a bidirectional manner and that rotates the polarization directions of the light passing therethrough by 45 degrees, the polarization dependence of the amplification apparatus 110 may be reduced. In addition, by providing the Faraday rotator 921 that propagates the light going back and forth between the SOA 115 and the second reflector 116 in a bidirectional manner and that rotates the polarization direction of the light passing therethrough by 45 degrees, the polarization dependence of the amplification apparatus 110 may be reduced.

Amplification Apparatus According to First Modification

Figure 10A:
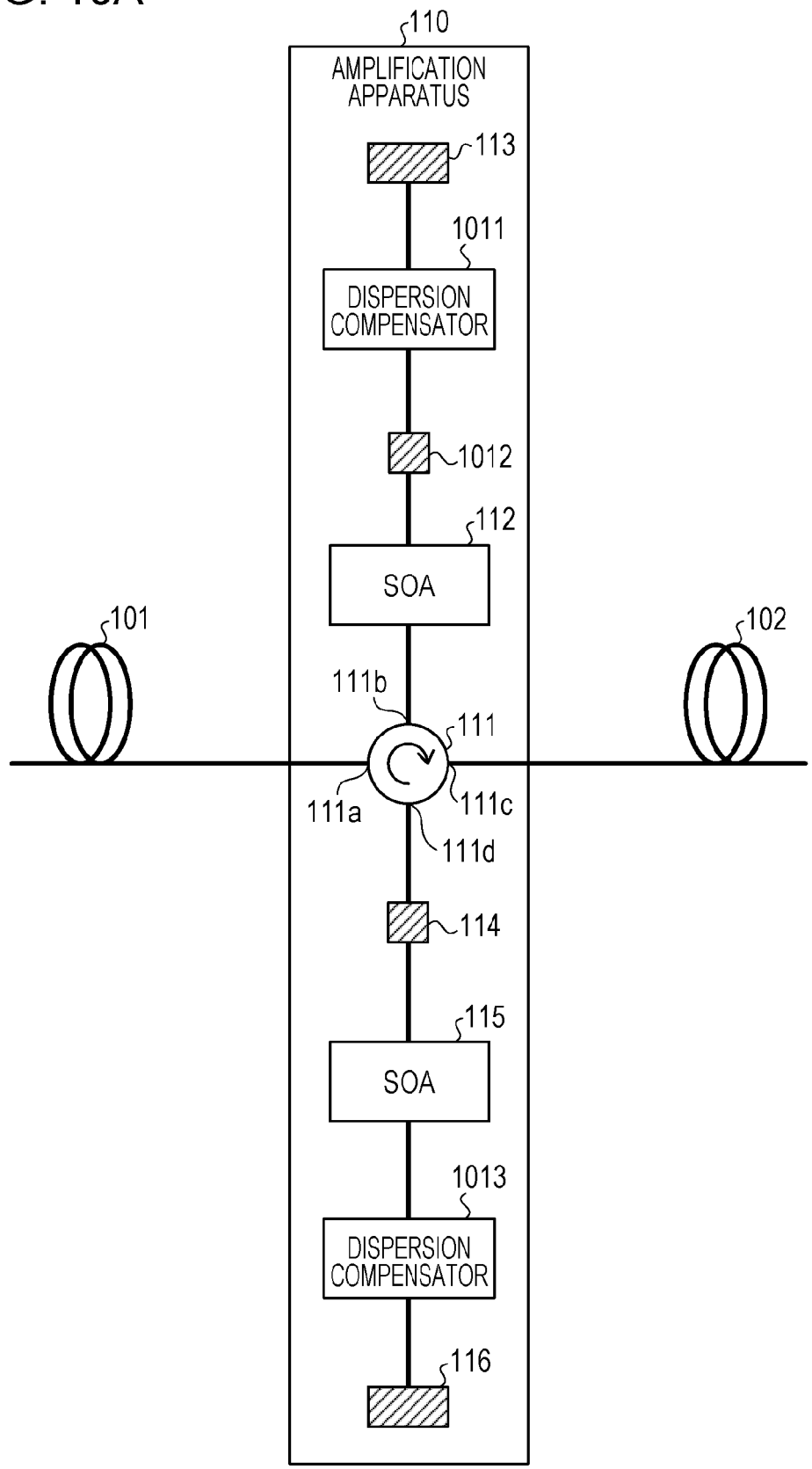
FIG. 10A is a diagram illustrating an amplification apparatus according to a first modification.
Figure 10B:
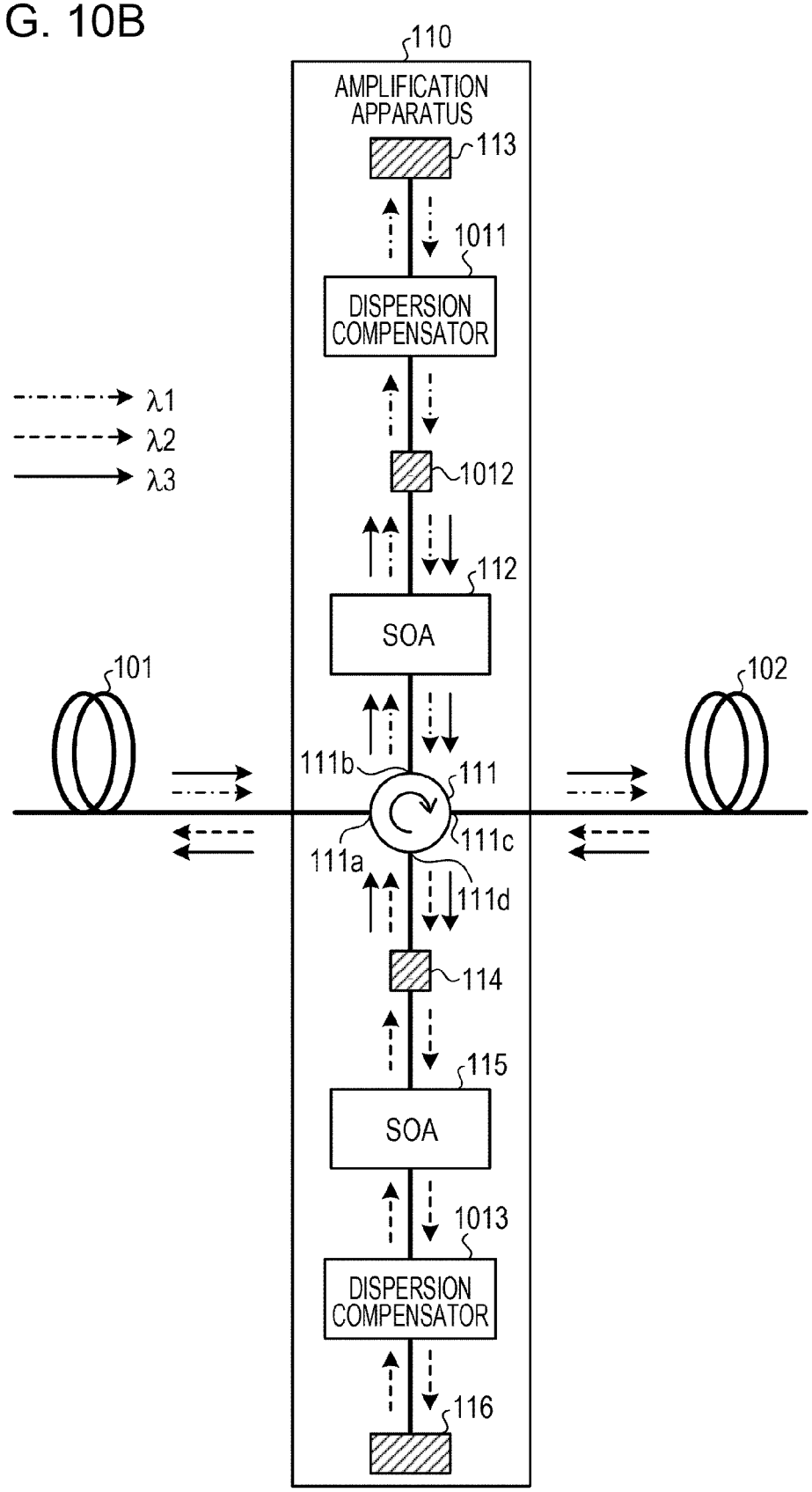
FIG. 10B is a diagram illustrating an example of traveling directions of light in the amplification apparatus illustrated in FIG. 10A.

FIG. 10A is a diagram illustrating an amplification apparatus according to a first modification. FIG. 10B is a diagram illustrating an example of traveling directions of light in the amplification apparatus illustrated in FIG. 10A. In FIGS. 10A and 10B, the same components as those illustrated in FIGS. 1A and 1B are given the same reference numerals, and description thereof is omitted. As illustrated in FIGS. 10A and 10B, an amplification apparatus 110 may include a dispersion compensator 1011, a partial reflector 1012, and a dispersion compensator 1013 in addition to the components illustrated in FIGS. 1A and 1B.

Alternatively, the reflector 900 illustrated in FIG. 9 may be adopted as each of a first reflector 113 and a second reflector 116 illustrated in FIGS. 10A and 10B. In doing so, polarization dependence such as a polarization dependent loss (PDL) and polarization mode dispersion (PMD) of the dispersion compensators 1011 and 1013 may be cancelled, thereby reducing the polarization dependence of the amplification apparatus 110.

The dispersion compensator 1011 is provided between a circulator 111 and the first reflector 113. In the example illustrated in FIGS. 10A and 10B, the dispersion compensator 1011 is provided between an SOA 112 and the first reflector 113. The dispersion compensator 1011 provides certain wavelength dispersion characteristics for light output from the SOA 112 to the first reflector 113 and light output from the first reflector 113 to the SOA 112. Accordingly, the wavelength dispersion of light input from a transmission path 101 to the amplification apparatus 110 and then output to a transmission path 102 may be compensated.

In addition, by providing the dispersion compensator 1011 between the SOA 112 and the first reflector 113, the SOA 112 may amplify light before and after passing through the dispersion compensator 1011, which is a loss medium. Accordingly, optical amplification characteristics including low noise and high efficiency may be obtained.

However, the dispersion compensator 1011 does not have to be provided between the SOA 112 and the first reflector 113, and the dispersion compensator 1011 may be provided between the circulator 111 and the SOA 112, instead. In this case, too, the wavelength dispersion of the light input from the transmission path 101 to the amplification apparatus 110 and then output to the transmission path 102 may be compensated.

The partial reflector 1012 is provided between the circulator 111 and the dispersion compensator 1011. In the example illustrated in FIGS. 10A and 10B, the partial reflector 1012 is provided between the SOA 112 and the dispersion compensator 1011. With respect to light beams having the wavelengths λ1 and λ3, respectively, output from the SOA 112, the partial reflector 1012 reflects the light beam having the wavelength λ3 and outputs the light beam having the wavelength λ3 to the circulator 111. The partial reflector 1012 propagates the light beam having the wavelength λ1 and outputs the light beam having the wavelength λ1 to the dispersion compensator 1011.

As described above, the dispersion compensator 1011 that propagates light going back and forth between a second terminal 111b of the circulator 111 and the first reflector 113 in a bidirectional manner and that provides the certain wavelength dispersion characteristics for the light passing therethrough is provided. In addition, the partial reflector 1012 is provided between the second terminal 111b of the circulator 111 and the dispersion compensator 1011. With respect to the light output from the second terminal 111b, the partial reflector 1012 reflects the light beam having the wavelength λ3 and outputs the light beam having the wavelength λ3 to the second terminal 111b. The partial reflector 1012 propagates the light beam having the wavelength λ1 and outputs the light beam having the wavelength λ1 to the dispersion compensator 1011.

Accordingly, with respect to the light beams having the wavelengths λ1 and λ3, respectively, input from the transmission path 101, the light beam having the wavelength λ1 may be subjected to wavelength dispersion compensation by passing through the dispersion compensator 1011, and the light beam having the wavelength λ3 may be kept from passing from the dispersion compensator 1011. For example, when the light beam having the wavelength λ3 is monitoring light, the light beam having the wavelength λ3 does not have to be subjected to the dispersion compensation. Therefore, by keeping the light beam having the wavelength λ3 from passing through the dispersion compensator 1011, no optical loss may be caused by the dispersion compensator 1011.

Although a configuration in which the partial reflector 1012 is provided between the SOA 112 and the dispersion compensator 1011 has been described with reference to FIGS. 10A and 10B, the partial reflector 1012 may be provided between the circulator 111 and the SOA 112, instead. In this case, too, the light beam having the wavelength λ3 may be kept from passing through the dispersion compensator 1011.

The dispersion compensator 1013 is provided between a partial reflector 114 and the second reflector 116. In the example illustrated in FIGS. 10A and 10B, the dispersion compensator 1013 is provided between an SOA 115 and the second reflector 116. The dispersion compensator 1013 provides certain wavelength dispersion characteristics for light output from the SOA 115 to the second reflector 116 and light output from the second reflector 116 to the SOA 115. Accordingly, the wavelength dispersion of light input from the transmission path 102 to the amplification apparatus 110 and then output to a transmission path 101 may be compensated.

In addition, by providing the dispersion compensator 1013 between the partial reflector 114 and the second reflector 116, the light beam having the wavelength λ3 may be kept from passing through the dispersion compensator 1013. For example, when the light beam having the wavelength λ3 is reflected light of the monitoring light, the light beam having the wavelength λ3 does not have to be subjected to the dispersion compensation. Therefore, by keeping the light beam having the wavelength λ3 from passing through the dispersion compensator 1013, no optical loss may be caused by the dispersion compensator 1013.

In addition, by providing the dispersion compensator 1013 between the SOA 115 and the second reflector 116, the SOA 115 may amplify light before and after passing through the dispersion compensator 1013, which is a loss medium. Accordingly, optical amplification characteristics including low noise and high efficiency may be obtained.

However, the dispersion compensator 1013 does not have to be provided between the SOA 115 and the second reflector 116, and the dispersion compensator 1013 may be provided between the partial reflector 114 and the SOA 115, instead. In this case, too, the wavelength dispersion of the light input from the transmission path 102 to the amplification apparatus 110 and then output to the transmission path 101 may be compensated. In addition, the light beam having the wavelength λ3 may be kept from passing through the dispersion compensator 1013.

As described above, the dispersion compensator 1013 that propagates the light going back and forth between the partial reflector 114 and the second reflector 116 in a bidirectional manner and that provides the certain wavelength dispersion characteristics for the light passing therethrough is provided. Therefore, with respect to the light beams having the wavelengths λ2 and λ3, respectively, input from the transmission path 102, the light beam having the wavelength λ2 may be subjected to wavelength dispersion compensation by passing through the dispersion compensator 1013, and the light beam having the wavelength λ3 may be kept from passing from the dispersion compensator 1013. For example, when the light beam having the wavelength λ3 is the monitoring light, the light beam having the wavelength λ3 does not have to be subjected to the dispersion compensation. Therefore, by keeping the light beam having the wavelength λ3 from passing through the dispersion compensator 1013, no optical loss may be caused by the dispersion compensator 1013.

Each of the dispersion compensators 1011 and 1013 is, for example, a fixed dispersion compensator such as a dispersion compensating fiber (DCF) that provides fixed wavelength dispersion characteristics for light passing therethrough. Alternatively, each of the dispersion compensators 1011 and 1013 may be a variable dispersion compensator that provides variable wavelength dispersion characteristics for light passing therethrough.

For example, when DCFs are used as the dispersion compensators 1011 and 1013, light to be subjected to the wavelength dispersion compensation passes through the dispersion compensator 1011 or 1013 twice, the wavelength dispersion compensation may be performed even if short DCFs are used as the dispersion compensators 1011 and 1013. Therefore, the wavelength dispersion compensation may be efficiently performed.

Although a case in which the amplification band of the SOA 112 includes the wavelengths λ1 and λ3 has been described, the amplification band of the SOA 112 may include only the wavelength λ3 and not include the wavelength λ1. In this case, for example, the partial reflector 1012 may be provided between the circulator 111 and the SOA 112. In doing so, the light beam having the wavelength λ1 input from the transmission path 101 may be kept from being incident on the SOA 112 and may be output to the transmission path 102.

In addition, when the partial reflector 1012 is provided, the light beam having the wavelength λ3 is not incident on the first reflector 113. Therefore, in the wavelength transmission characteristic line 701 of the first reflector 113 illustrated in FIG. 7, for example, the transmittance at the wavelength λ (for example, 1.61 [μm]) may be high (for example, about 0 [dB]).

In the configuration illustrated in FIGS. 10A and 10B, the reflector 900 illustrated in FIG. 9 may be adopted as the first reflector 113. In doing so, the polarization directions of the light beams having the wavelengths λ1 and λ3, respectively, that have passed through the dispersion compensator 1011 may be rotated by 90 degrees, and the light beams having the wavelengths λ1 and λ3, respectively, may pass through the dispersion compensator 1011 again. Accordingly, the polarization dependence of the dispersion compensator 1011 may be cancelled, thereby reducing the polarization dependence of the amplification apparatus 110.

In addition, in the configuration illustrated in FIGS. 10A and 10B, the reflector 900 illustrated in FIG. 9 may be adopted as the second reflector 116. In doing so, the polarization direction of the light beam having the wavelength λ2 that has passed through the dispersion compensator 1013 may be rotated by 90 degrees, and the light beam having the wavelength λ2 may pass through the dispersion compensator 1013 again. Accordingly, the polarization dependence of the dispersion compensator 1013 may be cancelled, thereby reducing the polarization dependence of the amplification apparatus 110.

Amplification Apparatus According to Second Modification

Figure 11A:
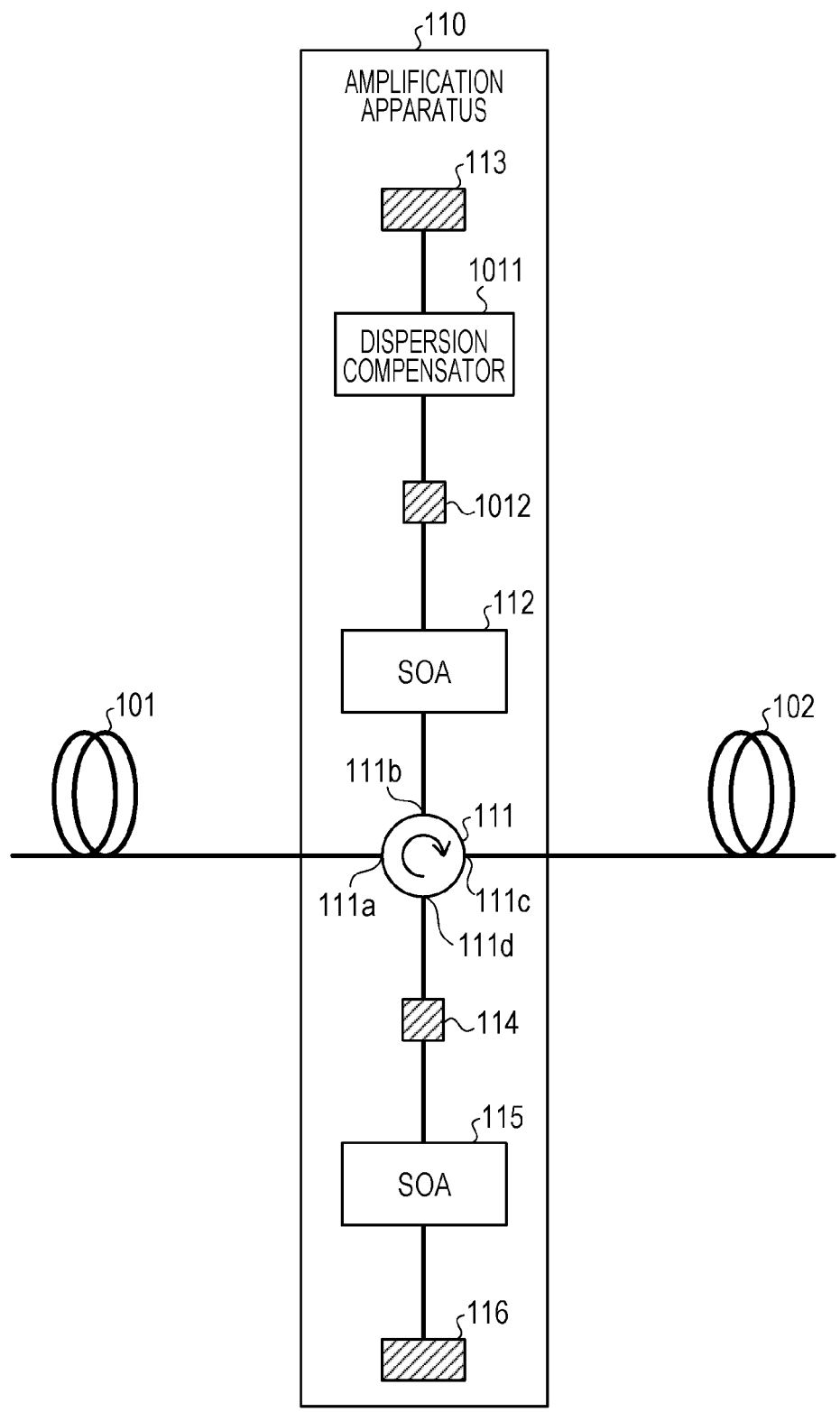
FIG. 11A is a diagram illustrating an amplification apparatus according to a second modification.
Figure 11B:
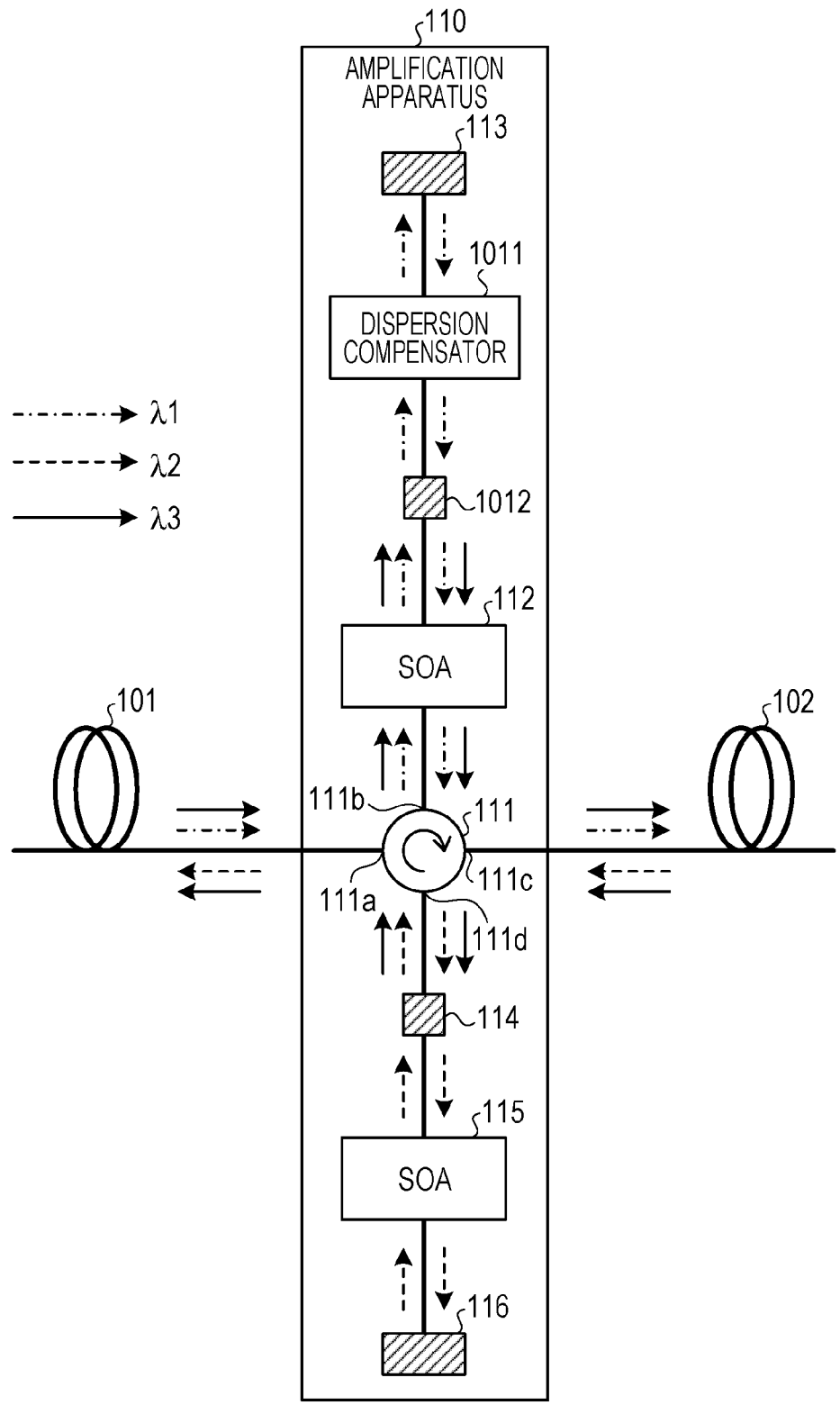
FIG. 11B is a diagram illustrating an example of traveling directions of light in the amplification apparatus illustrated in FIG. 11A.

FIG. 11A is a diagram illustrating an amplification apparatus according to a second modification. FIG. 11B is a diagram illustrating an example of traveling directions of light in the amplification apparatus illustrated in FIG. 11A. In FIGS. 11A and 11B, the same components as those illustrated in FIGS. 10A and 10B are given the same reference numerals, and description thereof is omitted.

As illustrated in FIGS. 11A and 11B, the dispersion compensator 1013 illustrated in FIGS. 10A and 10B may be omitted from the amplification apparatus 110. Similarly, the dispersion compensator 1011 and the partial reflector 1012 illustrated in FIGS. 10A and 10B may be omitted from the amplification apparatus 110, which is not illustrated.

As described above, according to the amplification apparatus and the communication system, failures in the transmission paths may be detected. The light beam having the wavelength λ3 input from the transmission path 102 to the amplification apparatus 110 is not limited to reflected light of the light having the wavelength λ3 input from the transmission path 101 to the amplification apparatus 110 and then output to the transmission path 102, and may be, for example, another signal light beam having the wavelength λ3, instead.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplification apparatus provided between an optical line terminal (OLT) and an optical network unit (ONU), the amplification apparatus comprising:

a circulator configured to output light incident on a first terminal from a second terminal, light incident on the second terminal from a third terminal, light incident on the third terminal from a fourth terminal, and light incident on the fourth terminal from the first terminal and to receive, at the first terminal, first signal light transmitted from the OLT to the ONU and first light having a predetermined wavelength different from a wavelength of the first signal light and, at the third terminal, second signal light transmitted from the ONU to the OLT and second light having the predetermined wavelength, the second signal light having a wavelength different from the wavelength of the first signal light and different from the predetermined wavelength;

a first reflector configured to reflect the light output from the second terminal and to output the reflected light back to the second terminal;

a first optical amplifier configured to be provided between the second terminal and the first reflector and to have an amplification band characteristic of amplifying at least the first signal light;

a second reflector configured to reflect the light output from the fourth terminal and to output the reflected light back to the fourth terminal;

a second optical amplifier configured to be provided between the fourth terminal and the second reflector and to have an amplification band characteristic of amplifying the second signal light without amplifying the second light having the predetermined wavelength; and a first partial reflector configured to have a wavelength transmission characteristic of propagating, in the light output from the fourth terminal, the second signal light and outputting the second signal light to the sound optical amplifier while reflecting the second light having the predetermined wavelength and outputting the reflected second light back to the fourth terminal.

2. The amplification apparatus according to claim 1, wherein the first optical amplifier is a semiconductor optical amplifier that amplifies the light output from the second terminal to the first reflector and the reflected light back to the second terminal.

3. The amplification apparatus according to claim 1, wherein the second optical amplifier is a semiconductor optical amplifier that amplifies the light output from the fourth terminal to the second reflector and the reflected light back to the fourth terminal.

4. The amplification apparatus according to claim 1, wherein reflectivity of the first reflector in a first wavelength band including the wavelength of the first signal light and the predetermined wavelength is higher than reflectivity of the first reflector in a second wavelength band different from the first wavelength band.

5. The amplification apparatus according to claim 4, wherein the first reflector is a dielectric multilayer film.

6. The amplification apparatus according to claim 1, wherein reflectivity of the second reflector in a third wavelength band including the wavelength of the second signal light is higher than reflectivity of the second reflector in a fourth wavelength band different form the third wavelength band.

7. The amplification apparatus according to claim 6, wherein the second reflector is a dielectric multilayer film.

8. The amplification apparatus according to claim 1, further comprising:
a Faraday rotator configured to rotate a polarization direction of light output from the first optical amplifier to the first reflector and the reflected light back to the first optical amplifier by 45 degrees, respectively.

9. The amplification apparatus according to claim 1, further comprising:
a Faraday rotator configured to rotate a polarization direction of light output from the second optical amplifier to the second reflector and the reflected light back to the second optical amplifier by 45 degrees, respectively.

10. The amplification apparatus according to claim 1, further comprising:
a dispersion compensator configured to provide a predetermined wavelength dispersion characteristic for the light output from the second terminal to the first reflector and the reflected light back to the second terminal; and
a second partial reflector configured to be provided between the second terminal and the dispersion compensator, to reflect the first light having the predetermined wavelength in the light output from the second terminal, and to output the first light having the predetermined wavelength to the second terminal while propagating the first signal light and outputting the first signal light to the dispersion compensator.

11. The amplification apparatus according to claim 10, wherein the dispersion compensator is provided between the first optical amplifier and the first reflector.

12. The amplification apparatus according to claim 10, further comprising:
a Faraday rotator configured to rotate a polarization direction of light output from the dispersion compensator to the first reflector and the reflected light back to the dispersion compensator by 45 degrees.

13. The amplification apparatus according to claim 1, further comprising:
a dispersion compensator configured to provide a predetermined wavelength dispersion characteristic for the light output from the first partial reflector to the second reflector and the reflected light back to the first partial reflector.

14. The amplification apparatus according to claim 13, wherein the dispersion compensator is provided between the second optical amplifier and the second reflector.

15. The amplification apparatus according to claim 13, further comprising:
a Faraday rotator configured to rotate a polarization direction of the light output from the dispersion compensator to the second reflector and the reflected light back to the dispersion compensator by 45 degrees.

16. The amplification apparatus according to claim 1, wherein the amplification apparatus is provided between the OLT and a splitter through which the OLT and the ONU are coupled to each other.

17. A communication system comprising:
an optical line terminal (OLT);
a plurality of optical network units (ONUs) coupled to the OLT through a splitter; and
an amplification apparatus provided between the OLT and the splitter,
wherein the amplification apparatus includes
a circulator configured to output light incident on a first terminal from a second terminal, light incident on the second terminal from a third terminal, light incident on the third terminal from a fourth terminal, and light incident on the fourth terminal from the first terminal and to receive, at the first terminal, first signal light transmitted from the OLT to the ONU and first light having a predetermined wavelength different from a wavelength of the first signal light and, at the third terminal, second signal light transmitted from the ONU to the OLT and second light having the predetermined wavelength, the second signal light having a wavelength different from the wavelength of the first signal light and different from the predetermined wavelength;
a first reflector configured to reflect the light output from the second terminal and to output the reflected light back to the second terminal;
a first optical amplifier configured to be provided between the second terminal and the first reflector and to have an amplification band characteristic of amplifying at least the first signal light;
a second reflector configured to reflect the light output from the fourth terminal and to output the reflected light back to the fourth terminal;
a second optical amplifier configured to be provided between the fourth terminal and the second reflector and to have an amplification band characteristic of amplifying the second signal light without amplifying the second light having the predetermined wavelength; and
a first partial reflector configured to have a wavelength transmission characteristic of propagating, in the light output from the fourth terminal, the second signal light and outputting the second signal light to the second optical amplifier while reflecting the second light having the predetermined wavelength and outputting the reflected second light back to the fourth terminal.

18. An amplification apparatus comprising:
a circulator configured to output light incident on a first terminal from a second terminal, light incident on the second terminal from a third terminal, light incident on the third terminal from a fourth terminal, and light incident on the fourth terminal from the first terminal;
a first reflector configured to reflect the light output from the second terminal and to output the reflected light back to the second terminal;
a first optical amplifier configured to be provided between the second terminal and the first reflector and to have an amplification band characteristic of amplifying at least first light having a first wavelength;
a second reflector configured to reflect the light output from the fourth terminal and to output the reflected light back to the fourth terminal;
a second optical amplifier configured to be provided between the fourth terminal and the second reflector and to have an amplification band characteristic of amplifying second light having a second wavelength without amplifying third light having a third wavelength different from the second wavelength; and
a partial reflector configured to have a wavelength transmission characteristic of propagating, in the light output from the fourth terminal, the light having the second wavelength and outputting the second light having the second wavelength to the second optical amplifier while reflecting the third light having the third wavelength and outputting the reflected third light back to the fourth terminal.

* * * * *

UNITED STATES PATENT AND TRADEMARK OFFICE
CERTIFICATE OF CORRECTION

PATENT NO. : 9,025,955 B2  
APPLICATION NO. : 14/049255  
DATED : May 5, 2015  
INVENTOR(S) : Miki Onaka Page 1 of 1

It is certified that error appears in the above-identified patent and that said Letters Patent is hereby corrected as shown below:

In the Claims

Column 16, Line 44, In Claim 1, delete "sound" and insert -- second --, therefor.

Signed and Sealed this
Eighteenth Day of August, 2015

Michelle K. Lee
*Director of the United States Patent and Trademark Office*